United States Patent [19]
Ogata

[11] Patent Number: 5,675,770
[45] Date of Patent: Oct. 7, 1997

[54] MEMORY CONTROLLER HAVING MEANS FOR COMPARING A DESIGNATED ADDRESS WITH ADDRESSES SETTING AN AREA IN A MEMORY

[75] Inventor: Yukihiko Ogata, Kawasaki, Japan

[73] Assignee: Canon Kabushiki Kaisha, Tokyo, Japan

[21] Appl. No.: 479,465

[22] Filed: Jun. 7, 1995

Related U.S. Application Data

[63] Continuation of Ser. No. 269,624, Jul. 1, 1994, abandoned, which is a continuation of Ser. No. 603,251, Oct. 25, 1990, abandoned, which is a continuation of Ser. No. 314,799, Feb. 24, 1989, abandoned, which is a division of Ser. No. 809,731, Dec. 17, 1985, Pat. No. 4,829,467.

[30] Foreign Application Priority Data

| Dec. 21, 1984 | [JP] | Japan | 59-268584 |
| Dec. 21, 1984 | [JP] | Japan | 59-268585 |
| Dec. 24, 1984 | [JP] | Japan | 59-271047 |
| Dec. 24, 1984 | [JP] | Japan | 59-271048 |

[51] Int. Cl.[6] ............................................. G06F 12/02
[52] U.S. Cl. ............... 395/497.04; 395/481; 395/421.03
[58] Field of Search ..................... 395/497.04, 492, 395/481, 402, 411, 421.03, 421.08, 846

[56] References Cited

U.S. PATENT DOCUMENTS

| 4,000,378 | 12/1976 | Caplan | 370/449 |
| 4,004,278 | 1/1977 | Nagashima | 395/413 |
| 4,024,510 | 5/1977 | Pearson | 395/595 |
| 4,562,532 | 12/1985 | Nishizawa et al. | 395/497.01 |
| 4,803,654 | 2/1989 | Rasberry et al. | 395/250 |

*Primary Examiner*—Matthew M. Kim
*Assistant Examiner*—Kevin L. Ellis
*Attorney, Agent, or Firm*—Fitzpatrick, Cella, Harper & Scinto

[57] ABSTRACT

It is desired to utilize two (or more) non-contiguous areas in memory as though they formed a single continuous area. An end address of a first memory area and a start address of a second memory area are set in a setting means. When the address in an address counter reaches the end address of the first of the two (or more) memory areas, the address counter is controlled to jump directly to the start address of the second area. By virtue of this structure, it become possible to access the first and second areas successively, as one continuous area, even though the two areas are separated from each other in the memory space.

9 Claims, 16 Drawing Sheets

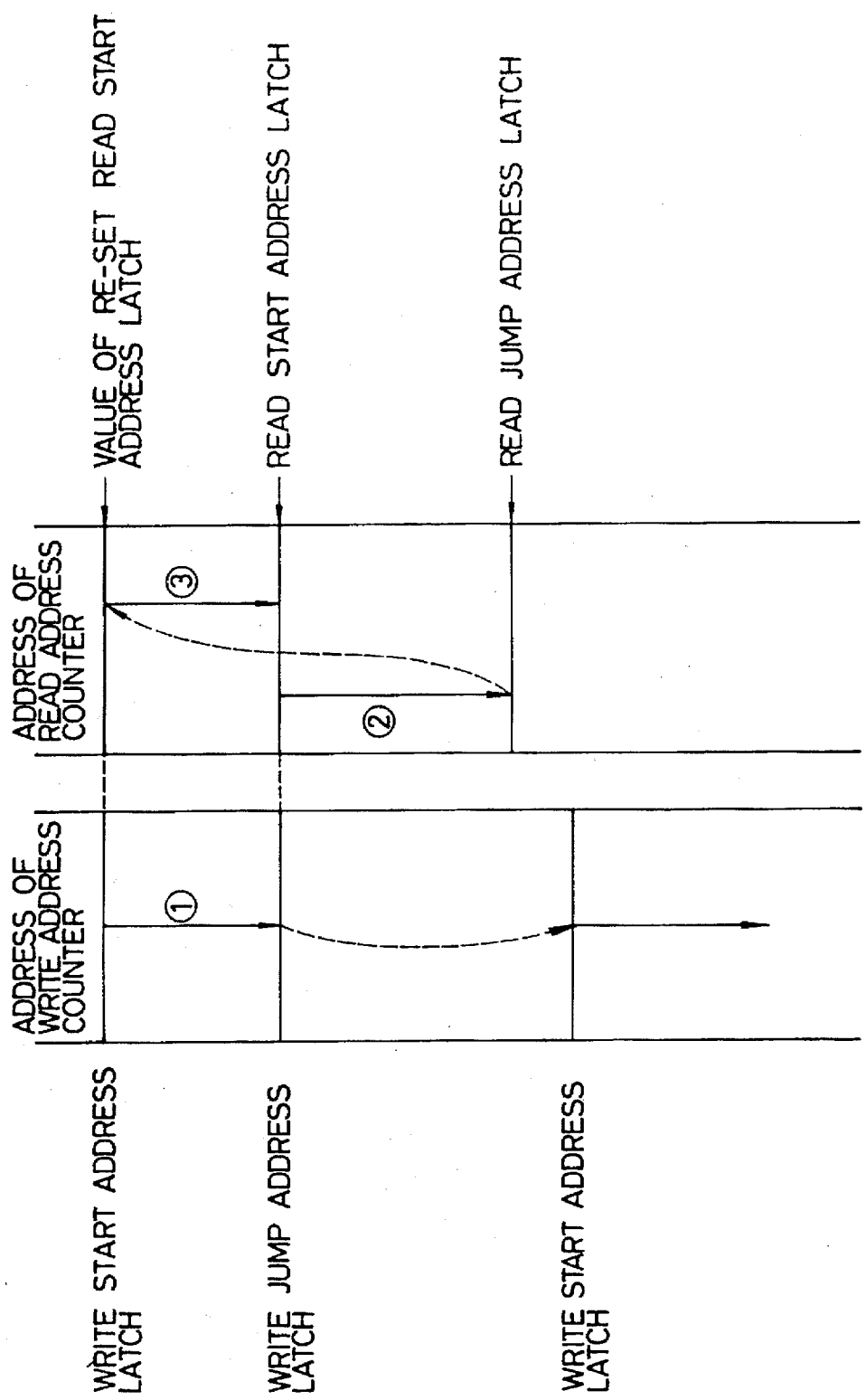

MEMORY CONTROLLER HAVING MEANS FOR COMPARING A DESIGNATED ADDRESS WITH ADDRESSES SETTING AN AREA IN A MEMORY

This application is a continuation of application Ser. No. 08/269,624 filed Jul. 1, 1994, now abandoned, which is a continuation of application Ser. No. 07/603,251 filed Oct. 25, 1990, now abandoned, which is a continuation of application Ser. No. 07/314,799 filed Feb. 24, 1989, now abandoned, which is a division of application Ser. No. 06/809,731 filed Dec. 17, 1985, now U.S. Pat. No. 4,829,467.

BACKGROUND OF THE INVENTION

1. Field of the Invention

The present invention relates to a memory controller.

2. Description of the Prior Art

A resource sharing system, which includes more than one resource and a plurality of resource access means sharing the resources, for competing accesses among the resource access means has been known. In such a resource sharing system, the optimum priority order of the system is to be dynamically changed but the priority order to resolve access competition is fixed. Accordingly, the throughput of an overall system is not improved. Where the frequency of access to the resources by one resource access means is low but its priority order is high, permission of access to the resources by the access means having a high frequency of access is postponed.

More specifically, the access competition in a memory circuit comprising a dynamic ram (DRAM) (DRAM will be a a resource) is explained.

FIG. 3 is a block diagram of a prior art memory control circuit of the DRAM. Numeral 107 denotes a crystal (XTAL) which supplies a basic clock of the DRAM control circuit to a timing generator 108. The timing generator 108 periodically generates a request sampling signal (RQSPL) by which logical states such as refresh request (REFRQ), write request (WRRQ) and read request (RDRQ) are latched into flip-flops (FF) 101, 102 and 103, respectively. (Those operations are called request sampling). In the prior art circuit of FIG. 3, the priority order is fixed to the order of REFRQ, WRRQ, RDRQ. The refresh request REFRQ has the highest priority. If this request is sampled, the WRRQ is neglected by a gate 104 and the RDRQ is neglected by gates 106 and 105. Similarly, if the WRRQ is issued, the RDRQ is neglected. In this manner, a priority order determination circuit 109 determines the processing to be next carried out.

On the other hand, a refresh counter 110 counts by a refresh clock (REF CLK) generated by the timing generator 108. The REF CLK generates the refresh clock at the same period as the RQSPL. When the refresh counter 110 counts up to a predetermined count (refresh time), a FF 111 is reset. The output of the FF 111 is the refresh request (REFRQ).

In FIG. 3, since the REQRQ is fixed to the highest priority, it is processed at the highest priority whatever other requests are. The output of the FF 101 is actually a refresh execution request signal (REFEX) and the timing generator 108 responds to the REFEX to carry out the refreshing by changing row data address signal (RAS), column data address signal (CAS) and write enable (WE) signal. The RAS, CAS and WE are collectively called a DRAM control signal. Numeral 113 denotes a memory circuit comprising a DRAM. At the end of the refreshing, the timing generator 108 generates a refresh request release signal (REFCLR) to reset the FF 111.

Write release signal (WRCLR) and read release signal (RDCLR) are also generated each time the writing and reading are carried out, respectively, and they are sent to a CPU (not shown) to release the requests. When the request is not accepted because of a higher priority request and it is not executed, the request release signal is not issued and the request remains.

The operation of the prior art circuit of FIG. 3 has thus been described. In the DRAM, the refreshing is essential and positively done by imparting the highest priority to the RERRQ. However, the refreshing has no direct connection to the data processing itself. If a lower priority is imparted to the refresh request than other requests, the refreshing has to wait each time the refresh request is issued. This is not appropriate for the prior art fixed priority order system.

In an image memory of a high speed facsimile machine which stores compressed image information, the writing of the image memory into the memory, which should be faster than the refreshing, must frequently wait. As a result, the processing speed of the machine decreases.

When a memory of a large capacity is to be constructed, a RAM is usually used for a memory whose major requirements are high speed and random access capability. In such a large capacity memory, a power consumption necessarily increases. Thus, in a stand-by state where the apparatus is not in operation, a main power supply is turned off to reduce the stand-by power consumption.

However, in a conventional RAM, stored information is erased when the power supply is turned off, except for a special non-volatile RAM. Thus, two systems of power supply are used so that a memory portion which stores important data and programs which are not to be extinguished is powered by a normally-ON power supply and another memory portion is powered by a power supply which is turned on only during the operation period. However, this requires a complex power supply configuration and an increase in overall cost.

In a recently developed image processing apparatus for processing image data, the memory capacity is large compared to a scale of the overall system. Thus, the proportion of power consumption by the memory is high in many cases. In such an apparatus, it is difficult from the space standpoint to have two channels of the power supply or the proportion of cost for the power supply is high.

When data is to be transferred by operating the memory at a high speed by a memory control circuit, it is necessary to drive the memory at a high speed. As a result, a timing condition to the drive waveform is severe. There is no timing margin for the control of data bus and errors are apt to be produced.

In prior art memory control circuits, only an address counter for counting the address, reset means for the address counter and read means for reading out the address from the address counter are provided. In such a circuit, when data is to be read while a large amount of data such as image information are temporarily stored, it is necessary to reset the address counter or stop writing when the memory becomes full while the address in the address counter is always monitored by a central processing unit (CPU) in order to prevent the data from being destroyed.

When the above processing is carried out without occupying a memory area in which unprocessed image data are stored, supervision by the CPU is also required. This eventually increases the workload of the CPU. As a result, the CPU cannot process its intended jobs at a high speed.

SUMMARY OF THE INVENTION

It is an object of the present invention to remove the drawbacks of the prior art as above-mentioned.

It is another object of the present invention to provide an improved memory controller.

It is another object of the present invention to provide a resource sharing system which can resolve access competition in an appropriate priority order even if access means to a resource (e.g. memory) compete.

It is still another object of the present invention to provide a memory controller which can suppress power consumption of a stand-by apparatus low with a simple configuration.

It is another object of the present invention to provide a memory controller which can read and write data from and to a memory at a high speed with a simple configuration.

It is another object of the present invention to provide a memory controller which dynamically constructs memory-accessable areas.

Other objects of the present invention will be apparent from the following description of the invention and the appended claims.

BRIEF DESCRIPTION OF THE DRAWINGS

FIG. 9, FIGS. 13A, 13B and 13C show the operation of a write address counter 401 and a read address counter 410.

DETAILED DESCRIPTION OF THE PREFERRED EMBODIMENTS

Figure 1:
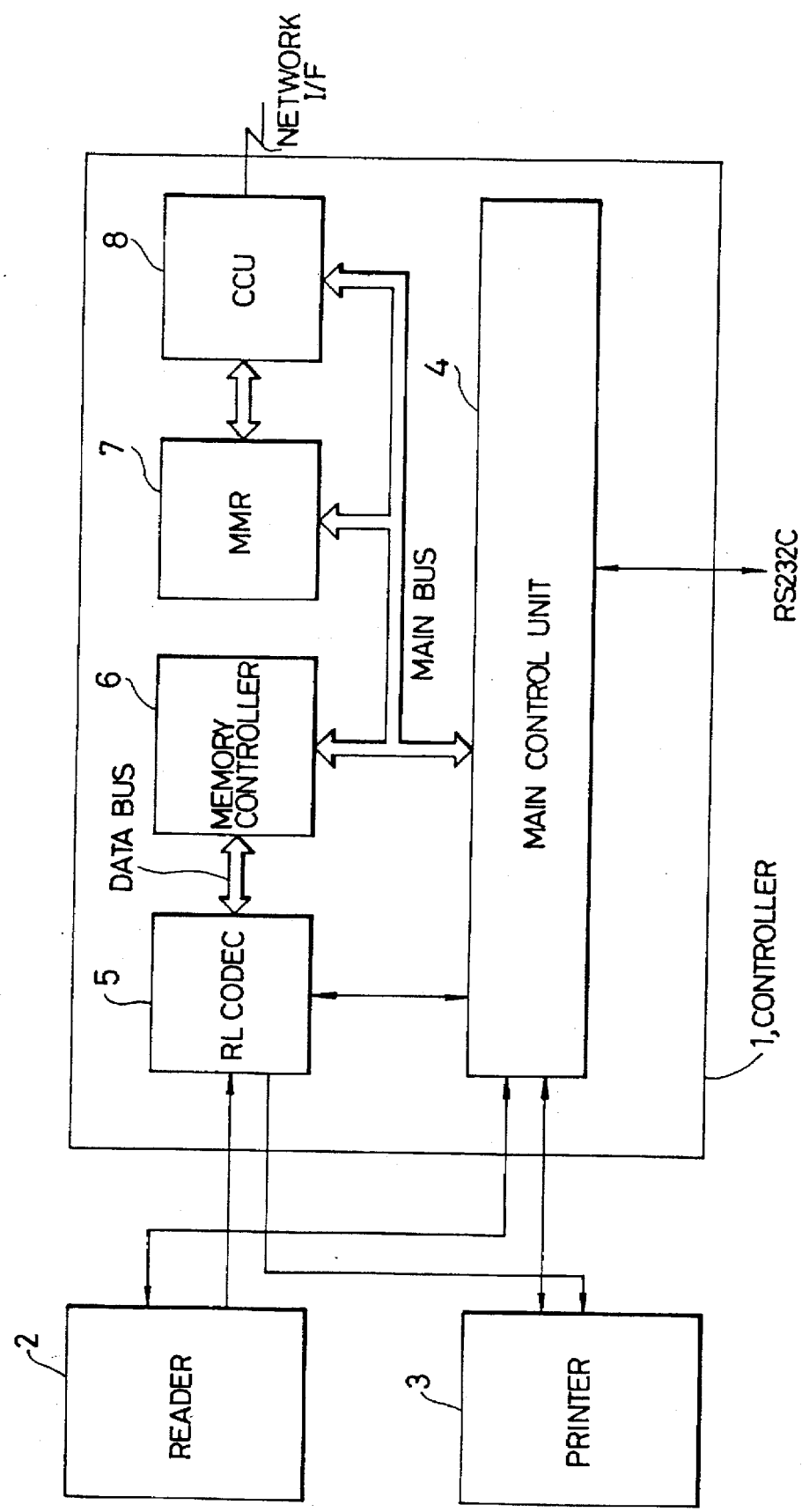
FIG. 1 shows a system configuration in which a memory controller is applied to a high speed image data communication apparatus.

FIG. 1 shows a system configuration in which a memory controller 6 in one embodiment of the present invention is used in a G4 facsimile machine which can transmit image data at a high speed and which is primarily connected to a digital line.

In FIG. 1, numeral 1 denotes a controller which controls a reader 2, a printer 3 and data communication. The controller 1 comprises a run length codec unit 5 which encodes and decodes run length codes, a memory controller 6, an MMR unit 7 which encodes and decodes (two-dimension encoding and decoding) modified READ Haffman codes, a communication control unit (CCU) 8 which controls data communication and a main controller 4 which controls the above units.

The operation of the above facsimile system is now explained with reference to data flow therein.

The data transmission is first explained.

The main controller 4 issues a start signal to start reading to the reader 2 and the run length codec unit 5. The reader 2 responds to the start signal to read an image. The image data read by the reader 2 is sent from the reader 2 to the run length codec unit 5 where it is run-length-encoded. When the run length codec unit 5 receives the image data, it sends an image data write request signal to the memory controller 6. When the run length codec unit 5 receives a write request acknowledge signal from the memory control unit 6, it sends the run-length-coded image data to the memory controller 6. When the memory controller 6 acknowledges the image data write request signal, it sets addresses to store the image data code by code. If the memory controller 6 is busy with another job when the run length codec unit 5 issues the write request signal, the reading of the image by the reader 2 and the run length encoding by the run length codec unit 5 are suspended. At the end of storing of one field of image data, an end signal is issued from the run length codec unit 5 to the main controller. 4. The main controller 4 sends an image data read request signal to the memory controller 6. When the memory controller 6 acknowledges the read request signal, it reads out the image data and sends it to the main controller 4 which in turn sends it to the MMR unit 7. The MMR unit 7 encodes the image data. The run-length-encoded image data has an end line code indicating an end of one line of data and an end page code indicating an end of one page of data added by the run length codec unit 5. The MMR unit 7 encodes the data based on the end line code and the end page code. The MMR encoded image data is sent from the MMR unit 7 to the CCU 8.

The reception operation is now explained.

The image data received through the line is sent from the CCU 8 to the MMR unit 7 in which it is run-length-decoded. The image data decoded in the MMR unit 7 is written into the memory control unit 6 by the main controller 4. The main controller 4 issues a write request signal to the memory controller 6. When the memory controller 6 acknowledges the write request signal, it writes the image data. The main controller 4 sends out the image data while it sets addresses and the memory controller 6 write the data one code at a time into the memory. The image data has the end line code and end page code attached thereto. At the end of writing into the memory, the main controller 4 sends a start signal to the run length codec unit 5, printer 3 and memory controller 6. When the memory controller 6 acknowledges the read request signal sent from the main controller 4, it reads out the image data and sends it to the run length codec unit 5, which decodes the image data to a dot data and sends it to the printer 3. In this manner, the image data is received and recorded.

Figure 2:
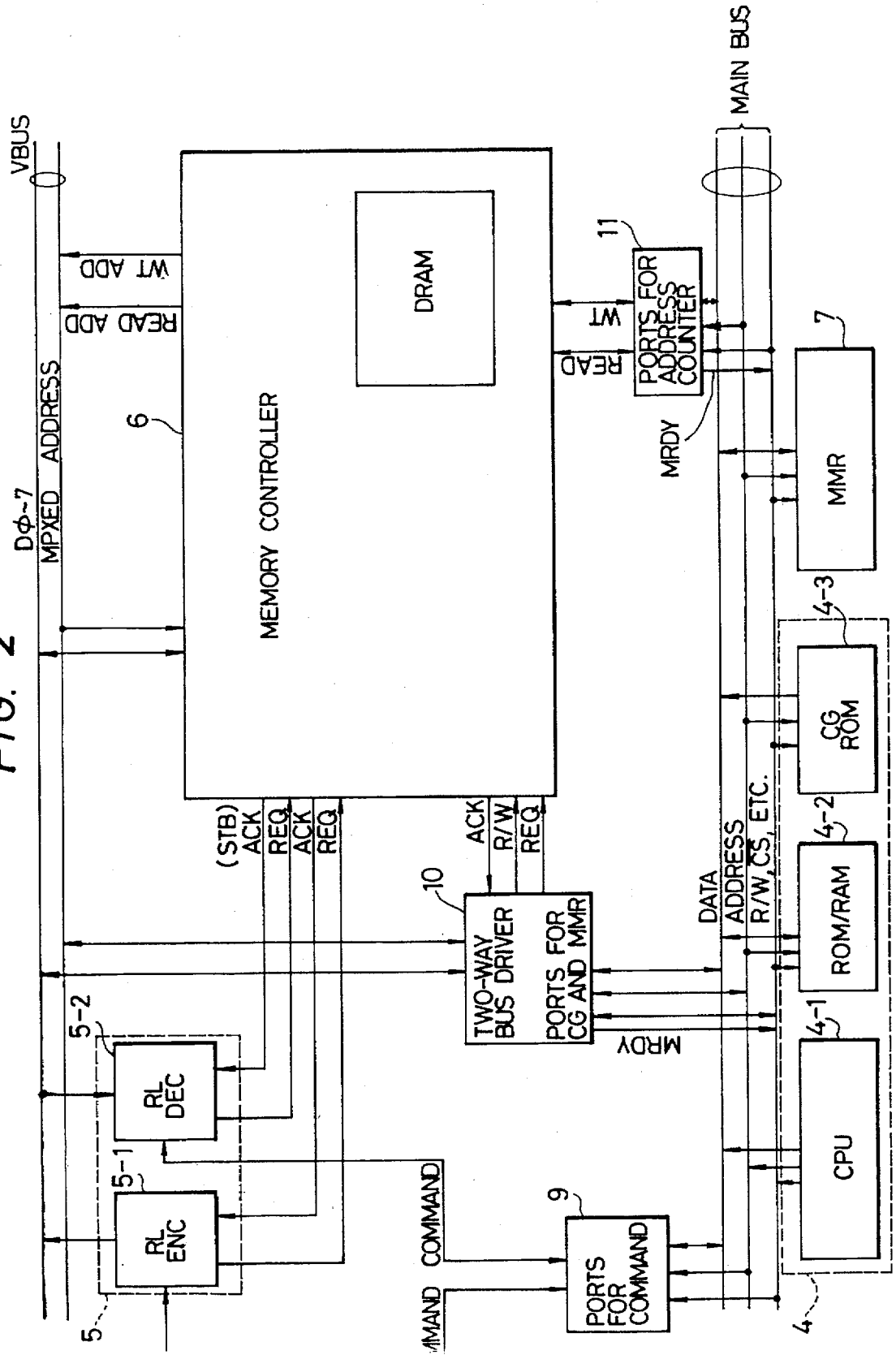
FIG. 2 shows a detail of periphery of a memory control circuit 6 in FIG. 1.

FIG. 2 shows a detail of a periphery of the memory controller 6 of a facsimile system shown in FIG. 1.

In FIG. 2, numerals 4-1, 4-2 and 4-3 denote CPU, ROM/RAM and CGROM (character generator ROM), respectively, of the main controller 4. Numeral 5-1 denotes a run length decoder and numeral 5-2 denotes a run length encoder. Numeral 9 denotes command ports of the run length decoder 5-1 and run length encoder 5-2. Numeral 10 denotes bilateral (or two-way) bus driver CG and MMR ports for connecting a VBUS (data or video bus in FIG. 1) with a main BUS. Numeral 11 denotes address counter ports for inputting to the memory controller 6 an address to write the image data by the CPU 4-1. The memory controller 6, run length codec unit 5, printer 3 and reader 2 are connected to the VBUS of FIG. 2. The CPU 4-1, ROM/RAM 4-2, CGROM 4-3, MMR 7 and CCU 8 are connected to the main bus.

When the image data on the memory controller 6 is to be read onto the main bus, the data is sent to the main bus from the VBUS through the bilateral bus driver and CG MMR ports 10.

The memory controller 6 is now explained. The memory controller 6 is constructed to access the data at two different speeds, because the data rate from the run length codec unit 5 is very high while the access speed by the CPU 4-1 is not so high.

The memory controller 6 can be accessed by the run length codec unit 5 and the CPU 4-1. The access request includes the read request and the write request. The data is written or read into or from the DRAM in accordance with the write request or read request. The DRAM must be refreshed in order to maintain the data stored therein. A refresh circuit is provided for this purpose and it periodically refreshes the DRAM.

The memory controller 6 in the present embodiment carries out one operation at a time. To this end, a priority order determination circuit is provided for the read request, the write request and the refresh request.

In order to store the data sent from the run length codec unit 5 into the memory at a high speed, the memory controller 6 is constructed to read and write the data from and into the memory at the high speed. The memory controller 6 has a circuit to sequentially determine addresses to write the data sent from the run length codec 5 into the memory.

Figure 4:
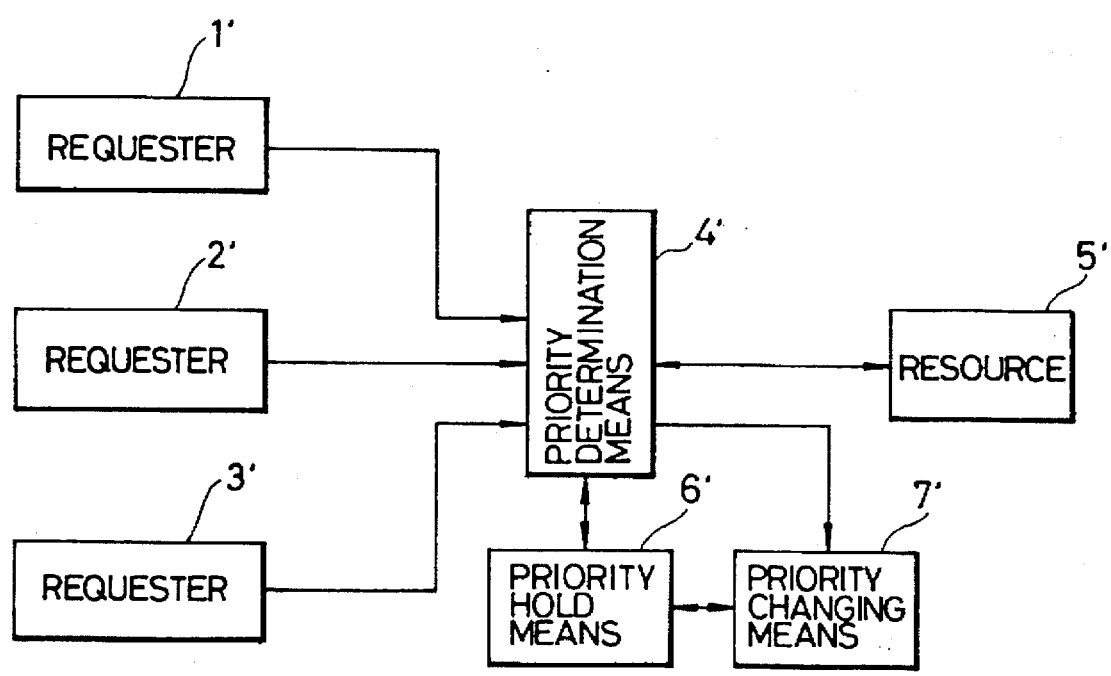
FIG. 4 shows the basic configuration of a priority order determination circuit in one embodiment of the present invention.

The priority order determination circuit of the memory controller 6 is explained. FIG. 4 is a conceptual view of the priority order determination circuit of the present invention. One resource 5' is shared by a plurality of requesters (access means) 1', 2' and 3' and the access competition thereamong is coordinated by priority order determination means 4' in accordance with a priority order in priority order hold means 6'. The priority order determination means 6' causes priority order change means 7' to change the order in accordance with a degree of the access competition. For example, when the access by the lowest priority requester 3' was suspended once and will be likely to be suspended once more, the priority thereof is temporarily raised to the top. The priority order determination circuit of the present embodiment is based on the conceptual view of FIG. 4.

Figure 5:
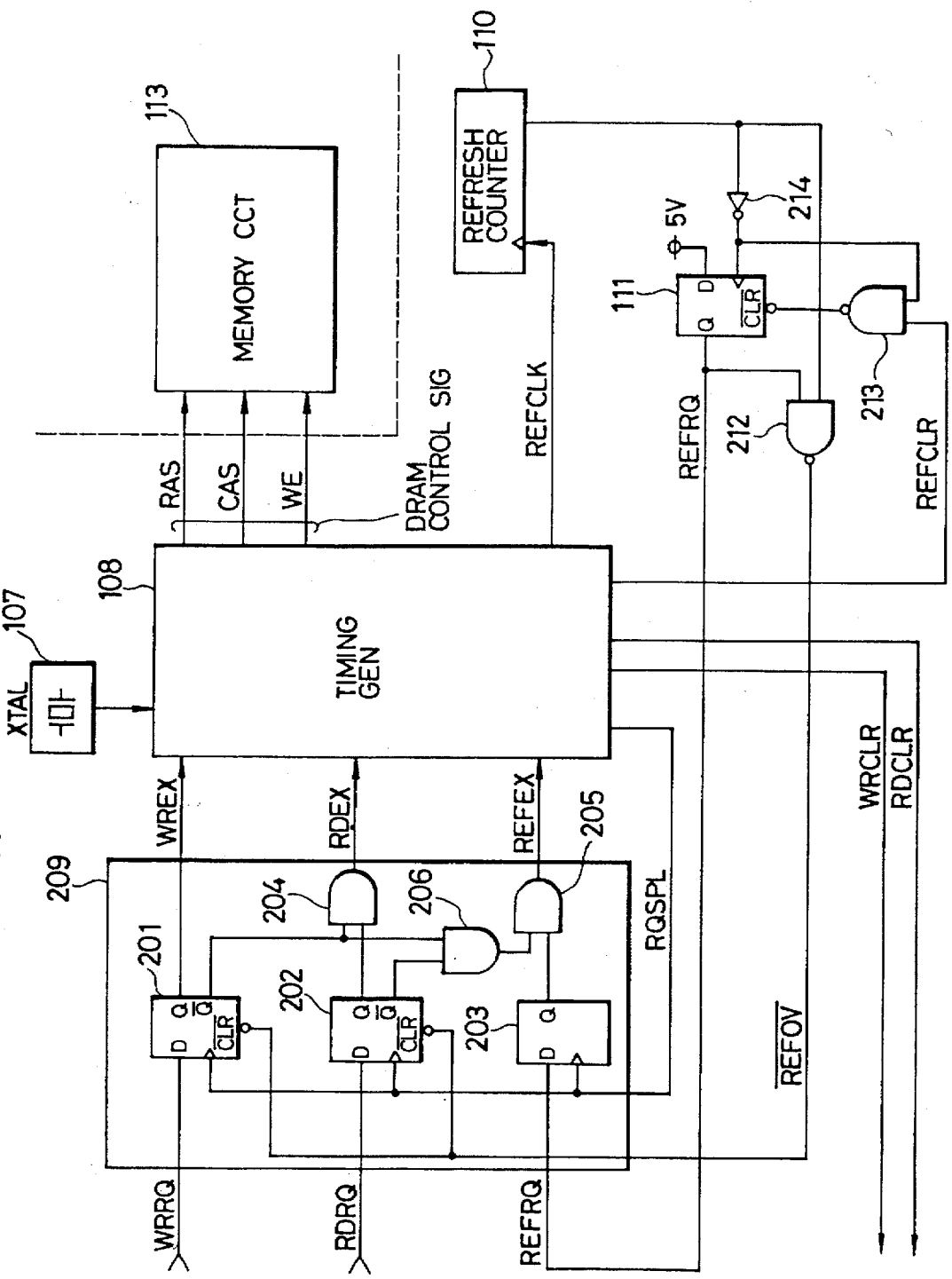
FIG. 5 shows a priority order determination circuit of the memory controller in one embodiment.

FIG. 5 shows a configuration of the priority order determination circuit of the memory controller 6'. XTAL 107, timing generator 108, refresh counter 110, FF 111 and memory 113 of FIG. 5 are similar to those of a prior art circuit shown in FIG. 3. In the present embodiment, the priority order of the requests is in the order of WRRQ, RDRQ, REFRQ. The REFRQ is normally at the lowest order. As a result, the WRRQ and RDRQ are processed with higher priority than the REFRQ. Accordingly, the data processing speed is increased.

However, if the higher priority WRRQ and RDRQ are sequentially issued, the REFRQ is kept waited. If the refresh request was once suspended and a refresh counter 110 again produces an output at the next refresh time, a gate 212 produces a forced refresh request signal REFOV/ ("/" at the end of the signal name indicates that the signal is negative logic). Since the REFOV/ is supplied to clear (CLR/) terminal of FF 201 and FF 202, the WRRQ and RDRQ are not latched and those requests are not accepted. Since a FF 203 keeps the REFRQ latched, the refresh request (REFEX) is processed with the highest priority.

The gate 213 serves in the following manner. The DRAM normally includes elements of a type which require a predetermined number of times of refreshing in a unit time. In such a DRAM, it is impossible to reduce a mean number of times of refreshing. Accordingly, even after the forced refreshing, the FF 111 is not reset by the refresh clear REFCLR to ascertain the mean number of times of refreshing.

Figure 6:
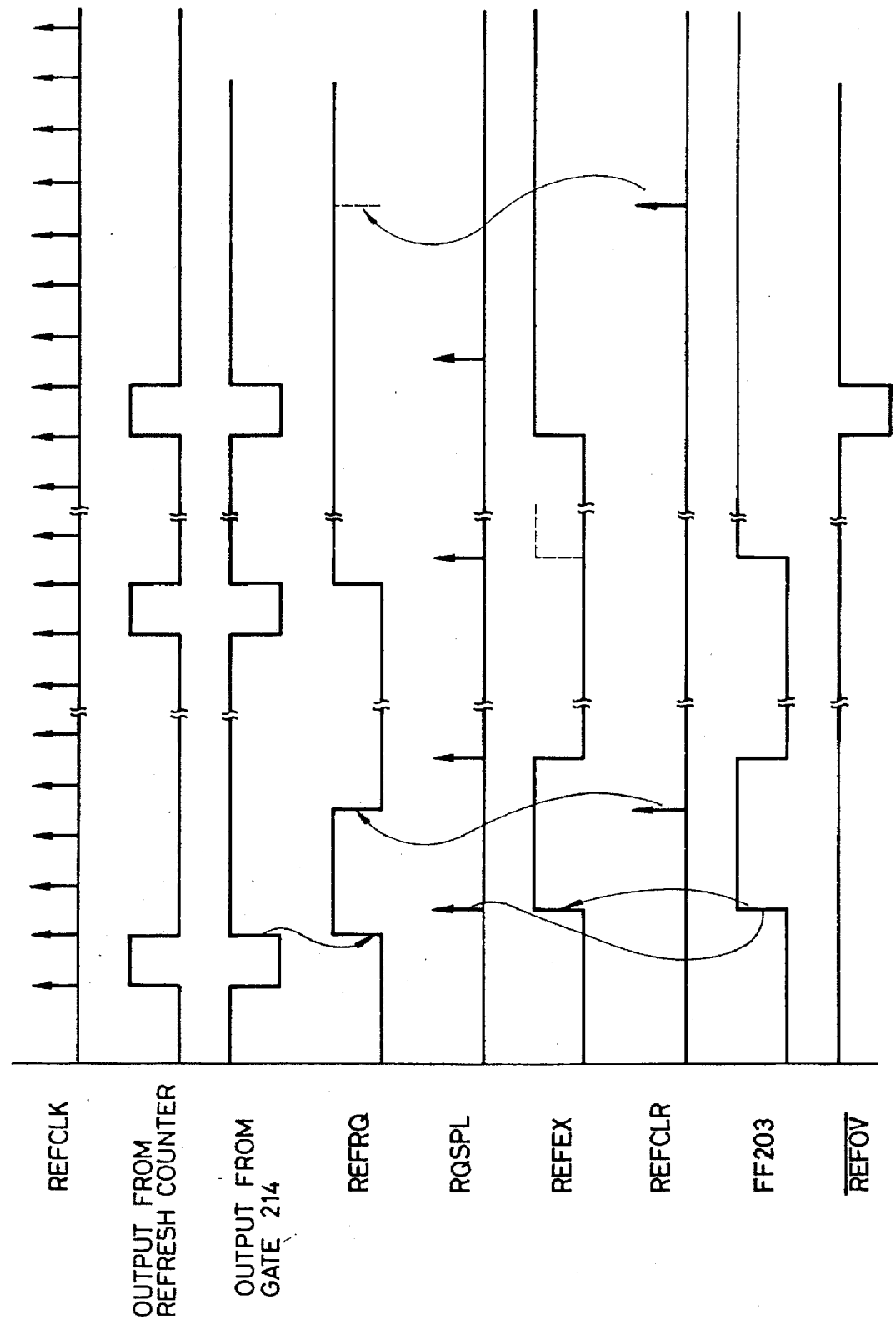
FIG. 6 is a time chart of the operation of the circuit of FIG. 5.

FIG. 6 shows a timing chart for the above operation. There are three times of refreshing in FIG. 6. At the first refresh time, there is no competing request and normal refreshing is completed. At the second refresh time, there is a competing request and hence the REFEX is not set to "1" even if the FF 203 is set. Accordingly, the FF 111 is kept set until the next refresh time. At the next refresh time, the REFOV/ is rendered "0" by the gate 212. Thus, even if there is a competition, the FF 201 and FF 202 are cleared and the memory 113 is forcibly refreshed. As described above, the FF 111 is not reset by the REFCLR generated by the forced refresh because of the gate 213. Therefore, the FF 203 is again set by the next RQSPL. Accordingly, if there is no other competition in the next memory cycle in accordance with the normal priority order, the refreshing is carried out. As a result, the mean number of times of refreshing is assured.

As described above, in accordance with the present priority order determination circuit, the access request other than the refreshing is carried out with a high priority and the necessary refreshing which is not directly related to the data processing is assured with the simple circuit configuration, and the processing speed of the overall system can be increased. When a redundancy-suppressed signal in a facsimile is to be stored, a write request and a read request are issued unperiodically by the redundancy-suppressed processing. For such requests, the processing speed is increased by accepting an access request other than the refreshing with the high priority.

When the resource is not a memory but a file unit or bus line, the efficient operation of the system is attained by temporarily raising the priority order of the low priority order requester.

The timing circuit for the write operation of the data sent from the VBUS of the memory controller 6 and the read operation of the data to the VBUS is now explained.

Figure 7:
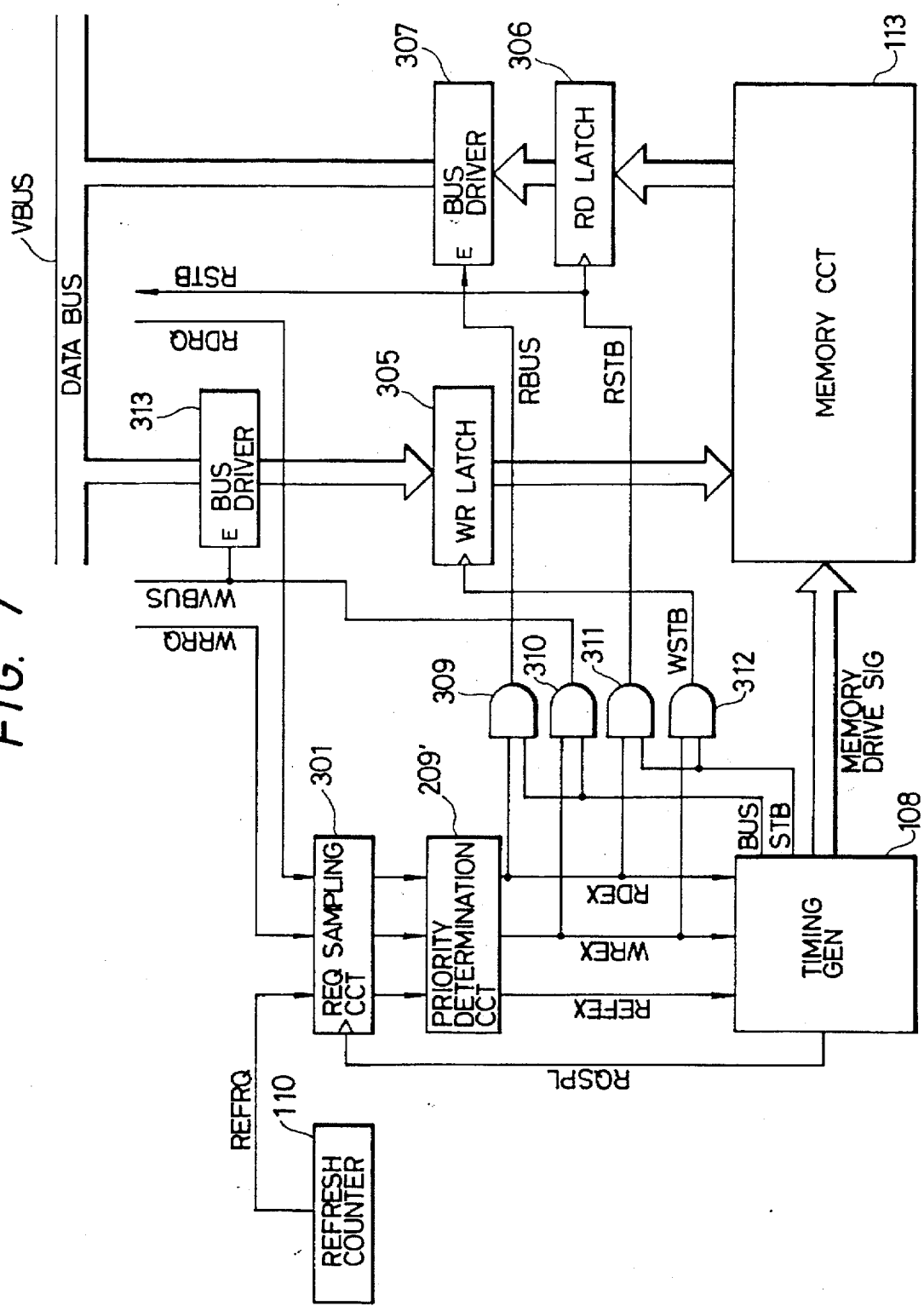
FIG. 7 shows a circuit configuration for timing writing and reading data in the memory controller 6.

FIG. 7 shows a circuit for timing the write operation of the data supplied from the VBUS of the memory controller 6 and the read operation of the data to the VBUS. The timing generator 108 generates a basic timing signal necessary to drive the memory, to drive the latch and to control the data bus. The timing generator 108 generates a request sampling signal RQSPL and the write request WRRQ, read request RDRQ and refresh request REFRQ are latched in a request sampling circuit 301. The priority order determination circuit 209' determines the priority orders of those requests and produces one of the write execution request (WREX), read execution request (RDEX) and refresh execution request (REFEX). The timing generator 108 generates the memory drive signal (e.g. RAS, CAS or WE) in accordance with that signal to cause the memory elements in the memory 113 to write or read the data or refresh the memory. In the present embodiment, the write or read operation is carried out between the memory 113 and the write (WR) latch 305 or read (RD) latch 306, and the latch operation from the data bus to the WR latch 305 or the read operation from the RD latch 306 to the data bus are carried out in parallel.

More specifically, when the write operation is designated by the WREX, only the signal WBUS of the signals BUS generated by the timing generator 108 is enabled by the gate 310. The bus driver 313 is enabled by the signal WBUS and the data on the data bus is read in. Then, only the signal WSTB of the signals STB generated by the timing generator 108 is enabled by the gate 312. The previous data is latched in the WR latch 305 by the signal WSTB. During this period, the memory 113 writes in the data sent from the WR latch 305.

When the above operation is carried out by software, a flag register to indicate whether the data has been latched in the WR latch 105 or not is required for the write operation. By monitoring the flag register, the memory controller latches the new data in the WR latch 305 or writes the data into the memory 113. In the present embodiment, no such flag is necessary because the writing from the WR latch 305 to the memory 113 and the latching of the next new data into the WR latch 305 are carried out in one sequence. Accordingly, the circuit configuration is simple.

The read operation is carried out in a similar manner. When the read operation is designated by the RDEX, the signals RBUS and RSTB are enabled by the gates 309 and 311 to send out the previously read data to the data bus. During this period, the memory 113 responds to the memory drive signal to start the read operation and the read data is latched in the RD latch 306 by the signal RSTB.

Figure 8:
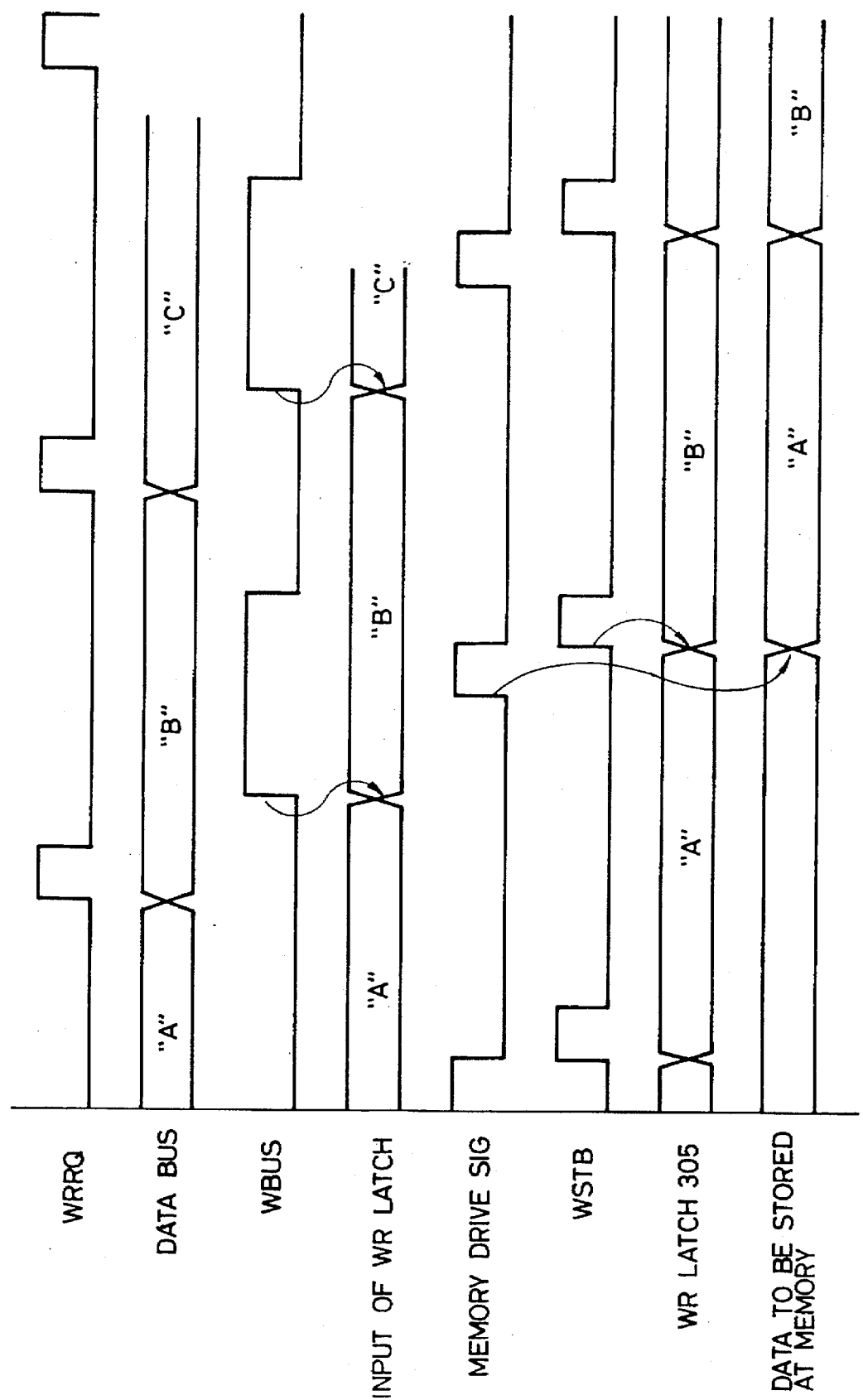
FIG. 8 is a time chart of the operation of the circuit of FIG. 7.

FIG. 8 shows a timing chart of the write operation in the present embodiment. When the bus driver 313 is enabled by the signal WBUS and the data on the data bus is supplied to the input of the WR latch 305, the previous data latched in the WR latch 305 is written into the memory 113 by the memory drive signal. The next write data is latched by the signal WSTB. In this manner, the latching of the data and the writing of the data into the memory are sequentially and essentially simultaneously carried out in one memory access.

In accordance with the above configuration in which the latch circuit is provided between the memory and the data bus, by starting the memory drive sequence and the control sequence for the latch circuit and the data bus by the same memory access request, the acknowledgement of transmission and reception of the data by the latch circuit is not necessary, and the high speed memory operation-and the timing margin of the data bus are attained by the simple circuit configuration.

The configuration of the memory controller 6 for dynamically structuring accessable areas of the DRAM is now explained.

Figure 9:
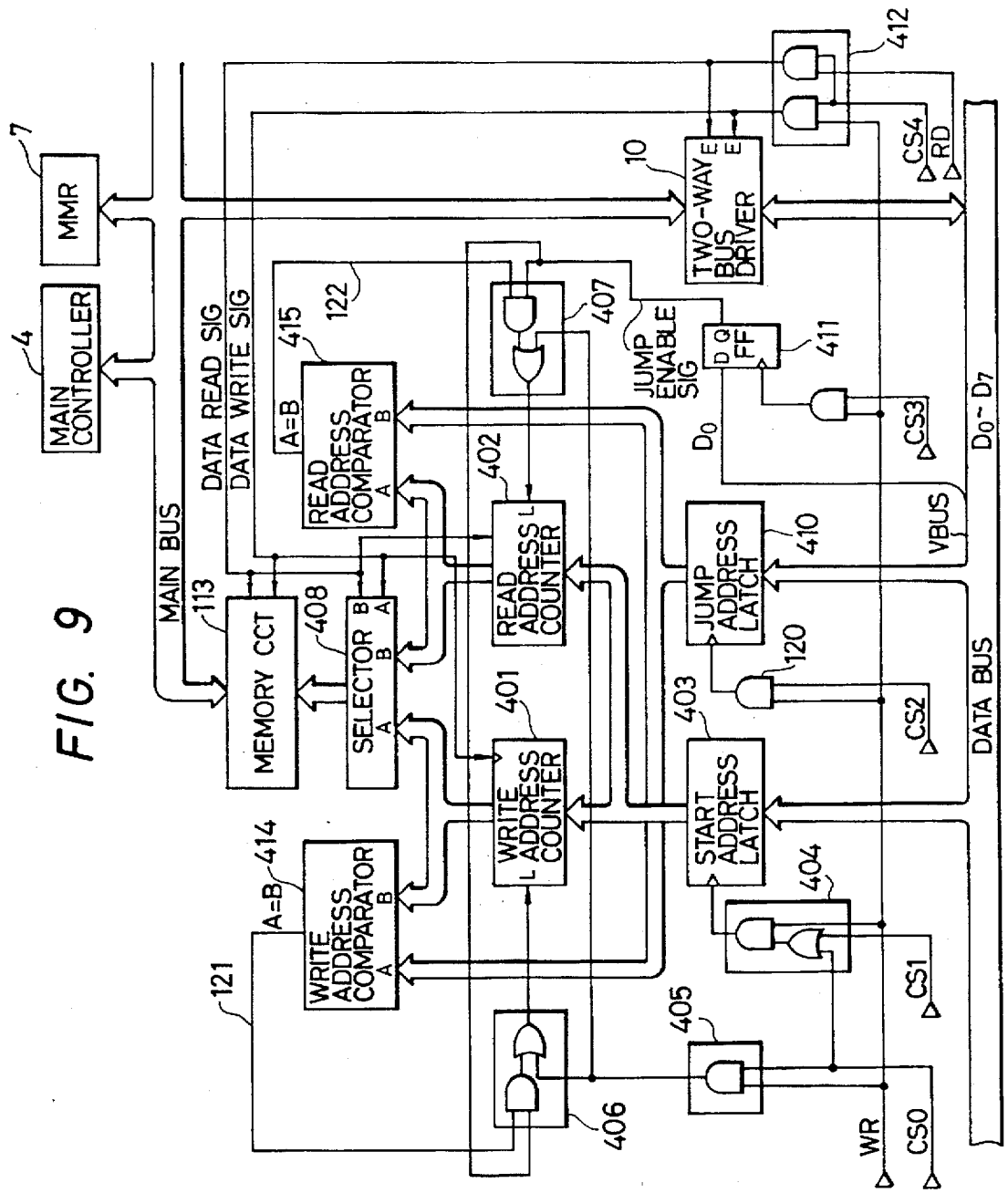
FIG. 9 shows a circuit configuration for constructing memory access areas in the memory controller 6.

FIG. 9 shows the memory 113 and a circuit for dynamically structuring memory-accessable areas. A write address counter 401 counts an address to store information on the VBUS (data bus) $D_0$–$D_7$ at the designated address in the memory 113 when the data is to be written. A read address counter 402 counts an address to read data from the designated address of the memory 113 when the data is to be read. The data on the VBUS (data bus) is sent to the main bus through the bilateral bus driver 10, and the data on the main bus is sent to the VBUS through the bilateral bus driver 10.

The main controller 4 or the run length condec unit 5 (see FIG. 2) produce the write signal WR, read signal RD and chip select signals $CS_0$–$CS_7$. The data are written or read into or from the memory in accordance with the signals WR, RD and $CS_0$–$CS_7$.

The functions of the respective elements of FIG. 9 are explained.

An address is latched in a start address latch 403 on a condition that:

(gate 404)=WR*($CS_0$+$CS_1$)

The address is latched in a jump address latch 410 on a condition that:

(gate 120)=WR*$CS_2$

The content of the start address latch 403 is loaded to the write address counter 401 on a condition that:

(gate 406)=WR*$CS_0$+(FF 411)*(A=B121)

Activating gates 404, 120 and 406, as set forth above, performs the first area setting. The first area setting is done by the main controller 4 through the bilateral bus driver 10. In the second condition, when the flip-flop (FF) 411 is in the set state and the write address counter 401 is counted up until the content thereof reaches the content of the jump address latch 410, the output A=B121 of the write address comparator 414 is "1".

The content of the start address latch 403 is loaded to the read address counter 402 on a condition that:

(gate 407)=WR*$CS_0$+(FF 411)*(A=B122)

As described above, the first area setting is performed by activating gates 404, 120 and 407. In the second condition, the read address counter 402 is counted up in the read operation and reaches the content of the jump address latch 410, and the FF 411 is in the set state.

The FF 411 which controls reloading of a new address to the read address counter 402 is set on a condition that:

(FF 411←1)=(WR*$CS_3$)*$D_0$

The main controller controls the value $D_0$ which is one of the data bus to control reloading of the write address counter 401 and the read address counter 402, that is, setting of the write or read start address.

The actual memory cycle to the memory 113 is started by the data read signal and the data write signal. In the write operation, (data write signal)=WR*$CS_4$ selects the address of the write address counter 401 by the selector 408 to start the memory cycle, and the write address counter 401 is incremented by one.

The data read signal is:

(data read signal)=RD*$CS_4$

Figure 10:
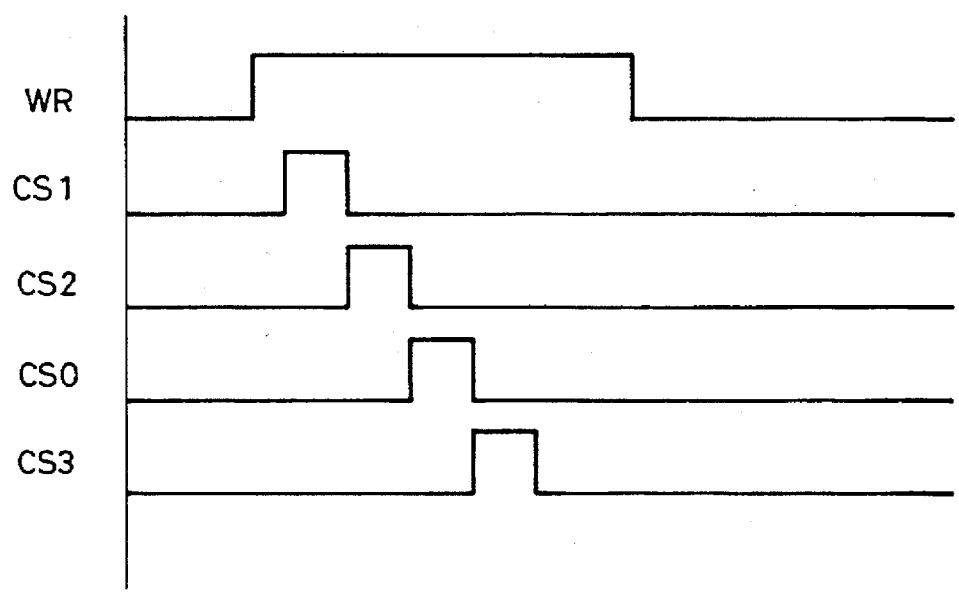
FIGS. 10, 11 and 12 show time charts of the operation of the circuit

FIG. 10 is a timing chart for presetting the counter, latch and FF. The preset timing or the timing to generate $CS_0$–$CS_3$ is not limited to one shown in FIG. 10.

Figure 11:
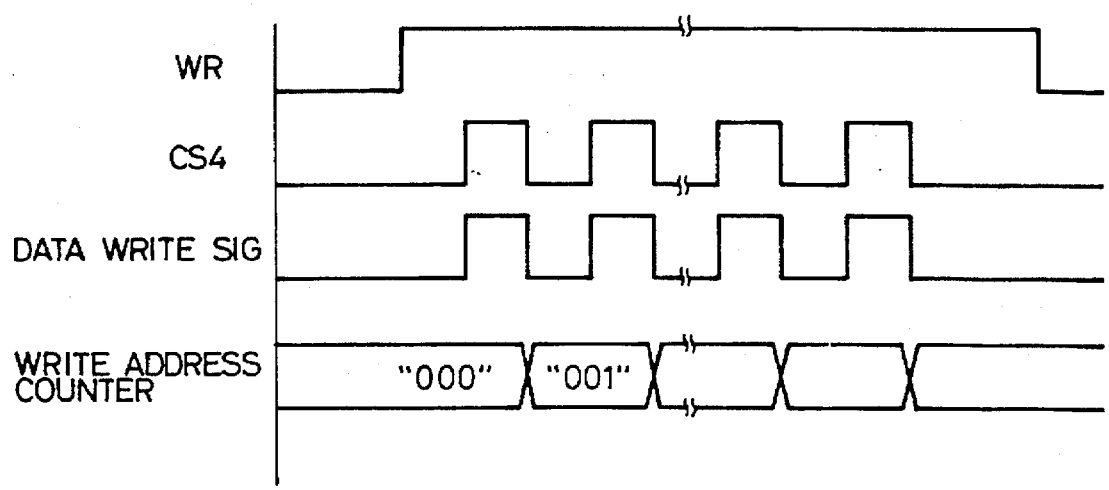

FIG. 11 shows a write timing chart. The main controller 4 sets the WR to "1" and sends out the data to $D_0$–$D_7$ through the bilateral bus driver 10 in synchronism with $CS_4$. As =described above, the gate 412 produces the data write signal by $CS_4$ and WR so that the bilateral bus driver 10 is enabled and $D_0$–$D_7$ are supplied to the memory 113. The data write signal selects the write address counter 401 by the selector 408 to cause the memory 113 to start the memory cycle, and increments the write address counter 401 at the fall of the data write signal.

Figure 12:
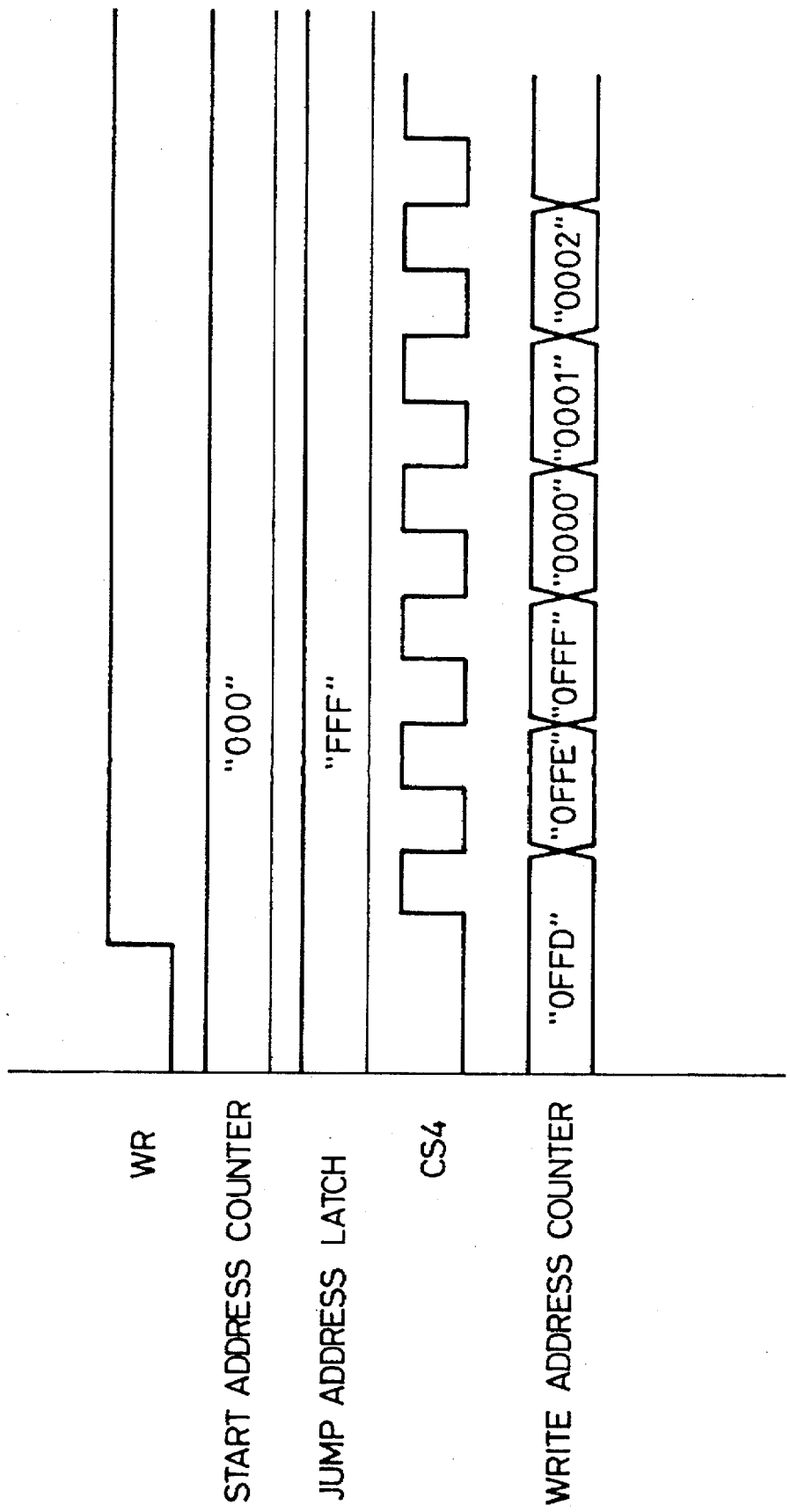

Whenever the main controller 4 sets the WR to "1" to send out the $CS_4$, it writes the data into the memory 113 as shown in FIG. 11. As the write address counter 401 is incremented, it approaches the content of the jump address latch 410. FIG. 12 shows that when the content of the write address counter 401 approaches and finally reaches the content of the jump address latch 410, the write address counter 401 is set to the content ("0000") of the start address latch 403. The following two points should be noticed.

First, the above setting is controlled by the set state of the FF 411. If the FF 411 is in the reset state, the write address counter 401, in the example of FIG. 12, is not set to "0000" from "0FFFF" but set to "1000".

Secondly, in the example of FIG. 12, the write address counter 401 is set to "0000" as seen from FIG. 9, and since the start address latch 403 can be relatched by WR*$CS_1$, it can start from other address.

A timing chart for the memory readout is similar to that of the memory write of FIG. 12 and hence it is omitted. The above two points are equally applicable to the memory readout.

Figure 13A:
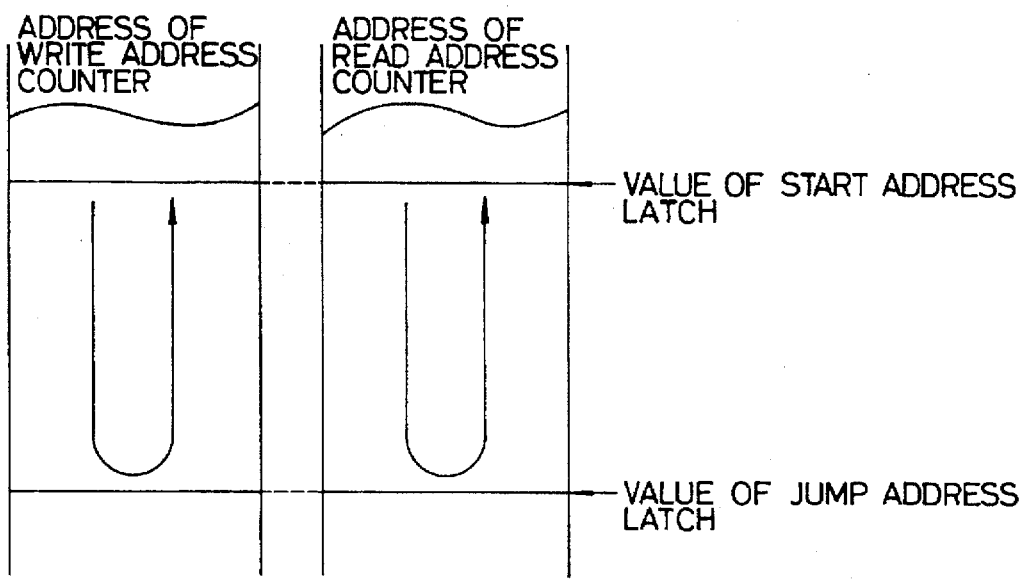

FIG. 13A shows that the write address counter 401 or the read address counter 402 of FIG. 9 circulates in the same address range when the FF 411 is in the set state. The address range is latched in the start address latch 403 and the jump address latch 410.

Figure 13B:
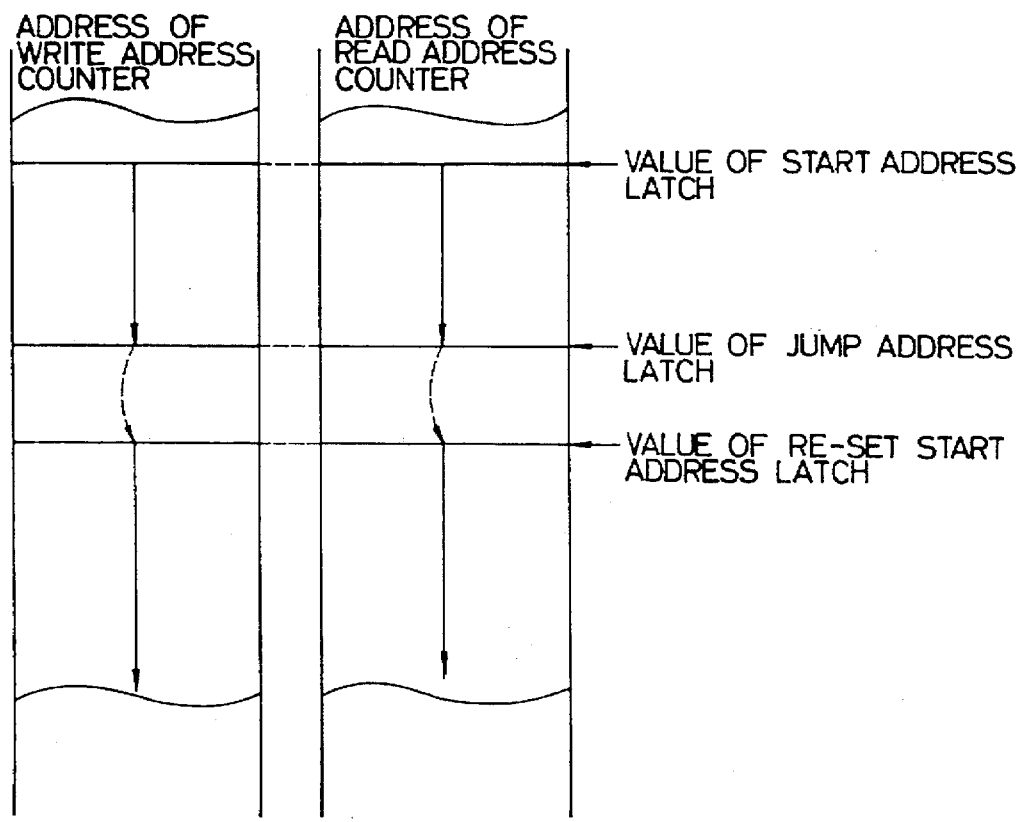

In FIG. 13B, before the content of the write address counter 401 or the read address counter 402 reaches the content of the jump address latch 410, the start address latch 403 is set by WR*$CS_1$. Thus, the re-start address jumps. In this case, by setting not only the start address latch 403 but also the jump address latch 410 at the timing of WR*$CS_2$, the jump to other areas is permitted. Thus, as seen from FIG. 13B, the access inhibit area can be set to effectively protect the data.

In the embodiment of FIG. 9, the write and read start addresses are generated by one start address latch 403, although separate latches may be provided. The same is true for the jump address latch 410. A read address latch and a read jump address latch may be added to the circuit of FIG. 9 so that the preexisting start address latch 403 and jump address latch 410 are exclusively used for writing (that is, write start address latch 403 and write jump address latch 410). Thus, as shown in FIG. 13C, the main controller 4 can read and write the data from and to the memory in an overlapped fashion and the data is not written into the area from which data is being read. The data is read from an area ② while the data is written into an area ①, and at the end of writing into the area ①, the read area is shifted from the area ② to an area ③ and the data written into the area ① is processed.

An interface circuit for reading out the outputs (addresses) of the write address counter 401 and the read address counter 402 may be provided and the FF 411 is kept reset so that the main controller 4 uses it while it monitors the address.

Since the burden of the main controller 4 required to reconstruct the memory areas is small, the main controller 4 is released from address monitoring and can concentrate to other processing. As a result, the overall throughout is improved.

The functions of the above embodiment and its modification are very effective for an image memory and a memory having a high degree of freedom can be constructed.

In this manner, the memory controller which reduces the burden and improves the overall throughput is provided.

Another embodiment of the memory controller which can suppress the power consumption of a memory such as a DRAM is now explained.

Figure 3:
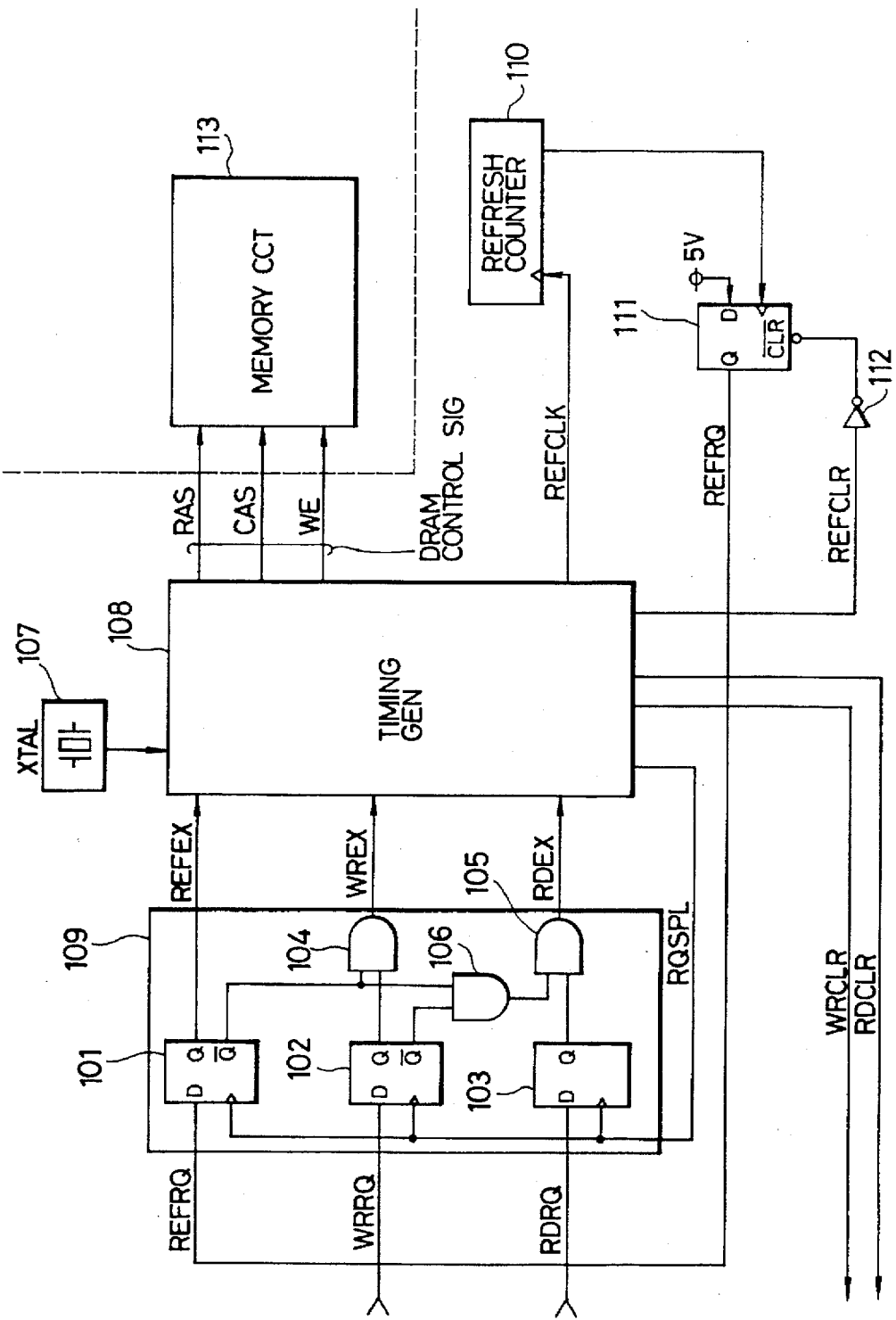
FIG. 3 shows a priority order determination circuit of a prior art memory controller.
Figure 14:
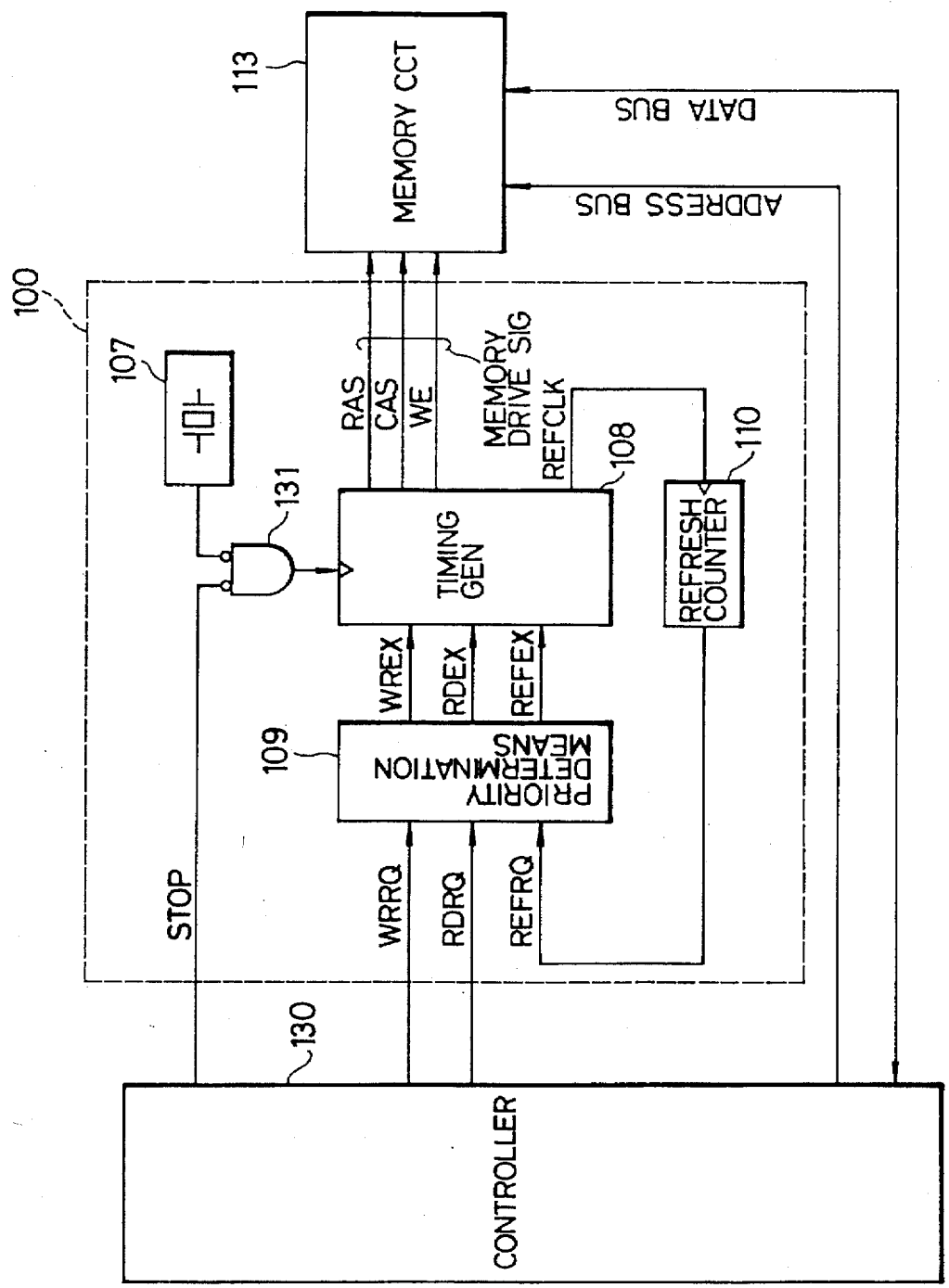
FIG. 14 shows a circuit configuration for reducing power consumption in another embodiment.

FIG. 14 shows the other embodiment of the memory controller. The elements in FIG. 14 which are designated by the same numerals as those shown in FIG. 3 are not explained here. Numeral 130 denotes a controller (CPU) which controls reading/writing of information from/to the memory 113. Numeral 100 denotes a memory controller which comprises the priority order determination circuit 109, timing generator 108, clock generator 107, gate 131 and refresh counter 110.

The priority order determination circuit 109 determines the order of the access request to the memory 113. More specifically, it selects one of the write request (WRRQ), read request (RDRQ) and refresh request (REFRQ) issued from the CPU 130 to produces one of the write execution signal (WREX), read execution signal (RDEX) and refresh execution signal (REFEX).

The timing generator 108 responds to the output of the priority order determination circuit 109 to generate DRAM drive signals (RAS, CAS, WE) and a refresh clock signal REFCLK which is a base of the refresh timing and a clock for the refresh counter 110.

The refresh counter 110 counts a refresh interval and generates the refresh request REFRQ at a constant interval.

On the other hand, the clock generator 107 has a reference clock generation source such as a crystal XTAL and generates the clock to drive the timing generator through the gate 131. One input to the gate 131 is a signal STOP supplied from the CPU 130. When the signal STOP is "1", the gate 131 is not opened and the timing generator cannot generate the timing signals RAS, CAS and WE. The refreshing is also stopped. Where the memory 113 is DRAM, most power is consumped by the refreshing. Accordingly, the stop of the refreshing serves to reduce the power consumption.

Where a number of memory boards each having the memory controller 100 and the memory 113 mounted thereon are provided in one system, the CPU 130 sets the signal STOP to "1" only for those memory boards which require the refreshing. Thus, two channels of power supplies are not required. Since the other memory boards are not refreshed, the overall power consumption is significantly reduced. This will be explained in connection with FIGS. 15 and 16.

Figure 15:
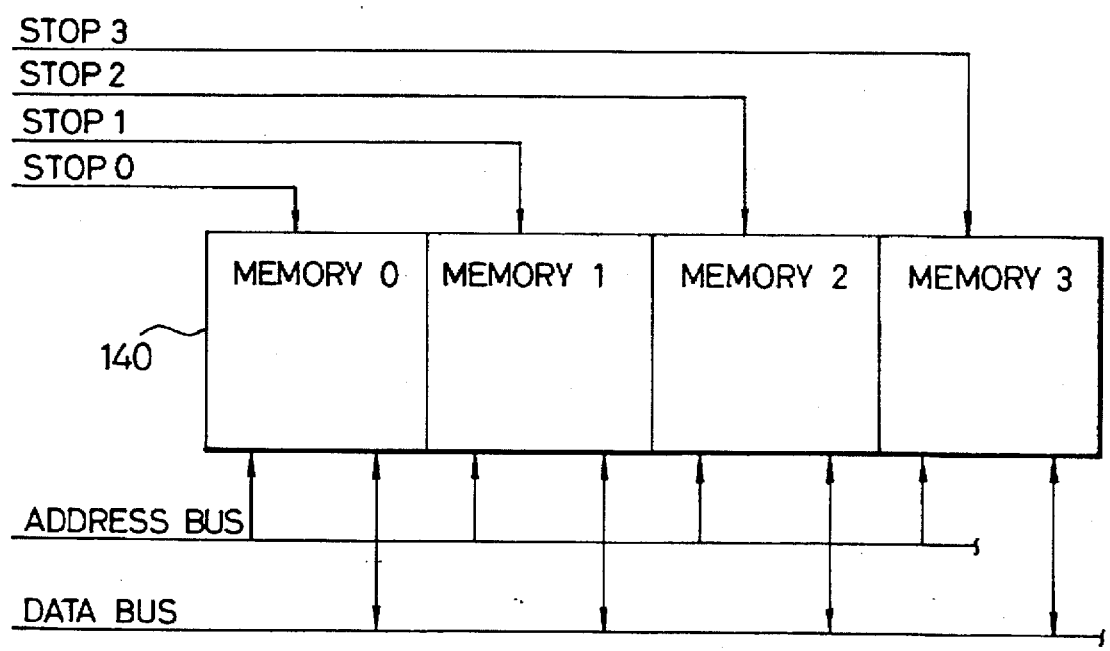
FIG. 15 shows a modification of the circuit configuration of FIG. 14.
Figure 16:
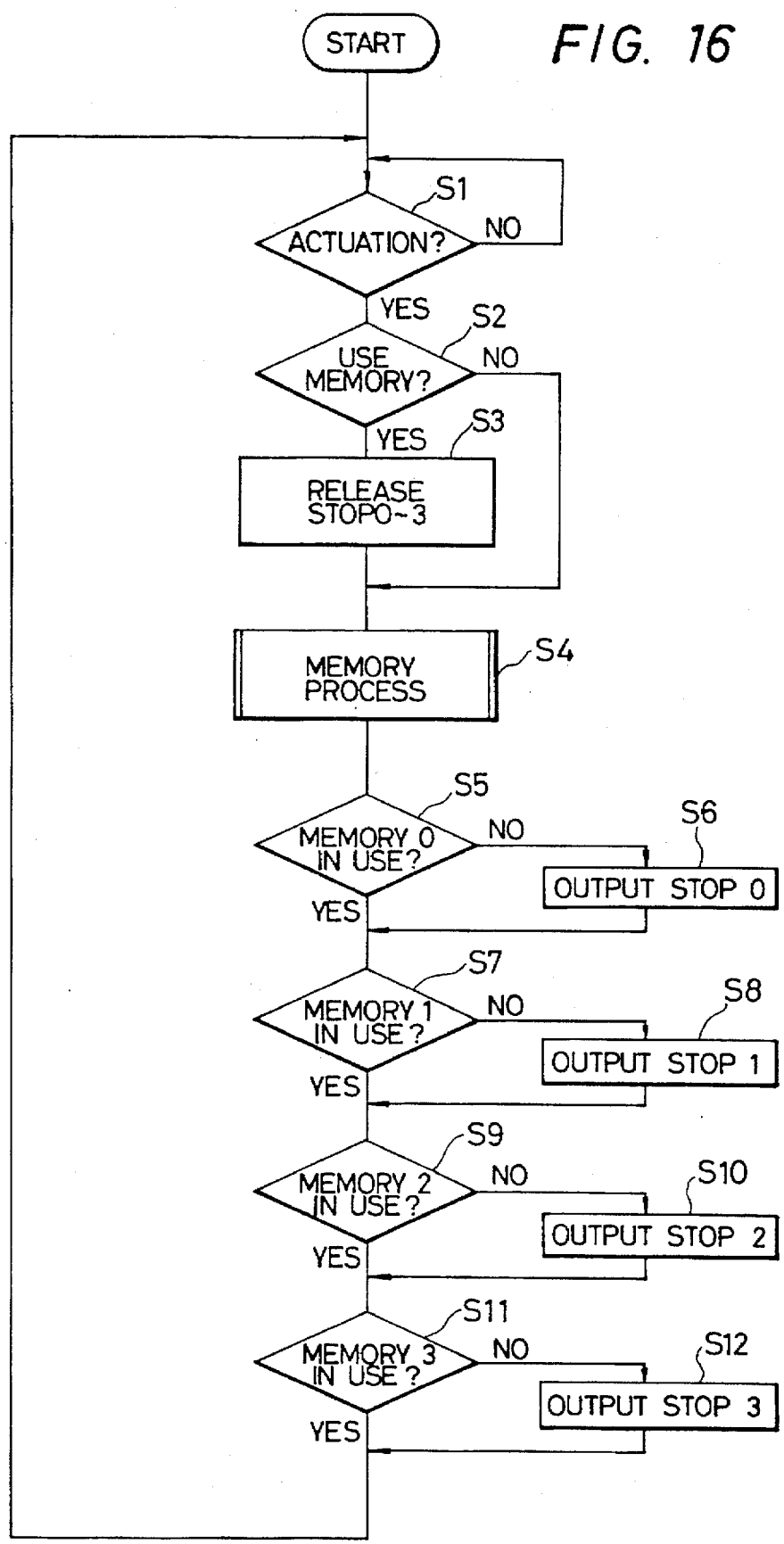
FIG. 16 shows a flow chart of the operation of circuit of FIG. 15.

In FIG. 15, four memory boards 140 each having the memory controller 100 and the memory 113 mounted thereon are provided. FIG. 16 shows a flow chart of a control operation of the controller 130 in the configuration of FIG. 15. In a step S1, the start is checked, and if the memory controller is started, the process proceeds to a step S2. In the step S2, whether the memory is to be used or not is checked, and if it is, the process proceeds to a step S3 where STOP 0–3 are released, and the process proceeds to a step S4. If the memory is not to be used in the step S2, the process proceeds to the step S4. In the step S4, the information is stored. In a step S5, whether the memory 0 is busy or not is checked, and if it is busy, the process proceeds to a step S7, and if it is not busy, the process proceeds to a step S6 where STOP 0 is produced. In steps S7, S8, S9, S10, S11 and S12, whether the memory 1, 2 or 3 is busy or not is checked as was done for the memory 0, and if it is not busy, the STOP signal is produced. When the above operation is completed for the memory 3, the process returns to the step S1.

By generating the memory timing only for those memory boards which require the memory operation, the power consumption can be reduced.

In the present embodiment, the memory 113 is the DRAM. When a static RAM (SRAM) which does not require the refreshing is used instead of the DRAM, the power consumption can also be reduced, because the power consumption in the SRAM increases so long as the clock is supplied even if the read/write operation of the memory is actually not carried out.

A modification of the present embodiment is now explained. In the embodiment of FIG. 14, the supply of the clock is stopped. Alternatively, the refresh counter 110 may be stopped or the memory drive signals (RAS, CAS, WE) may be inhibited by the gate circuit to block the memory drive signal.

In this manner, the power consumption of the stand-by memory can be significantly reduced by the simple configuration without a special power supply.

In the present embodiment, the memory controller is used the facsimile system which communicates the image data, although the memory controller of the present embodiment can be applied to not only the facsimile system but also any apparatus which reads and writes the data.

The present invention is not limited to the illustrated embodiments but various modifications may be made within a scope of the appended claims.

What is claimed is:

1. A memory controller comprising:

area setting means for setting at least first and second accessible continuous areas of a memory by setting at least a first address and a second address, wherein the first address and second address are changeable and wherein the first address represents a start address of the second accessible continuous area and the second address represents an end address of the first accessible continuous area;

address count means for counting an address in the memory; and comparing means for comparing the address counted by said address count means with the second address set by said area setting means, wherein said address count means is loaded with the first address representing the start address of the second accessible continuous area of the memory in response to said comparing means showing a coincidence between the counted address and the set second address, and wherein said address count means skips any address between the first and second addresses to successively count the addresses in the first and second areas such that the first and second areas can be treated as one continuous accessible area.

2. A memory controller according to claim 1, further comprising:

a plurality of buses for transferring data through said memory controller to and from the address pointed to by the address count means in the memory, and drive means for driving the data being transferred from said memory controller onto said buses.

3. A memory controller according to claim 2, further comprising access means for producing a memory access signal to the memory and said drive means, wherein said drive means operates so as to transfer data between the memory and said memory controller in response to the memory access signal from said access means.

4. A memory controller according to claim 2 wherein said buses include a data bus and a main bus.

5. A memory controller according to claim 1, further comprising instruction means for setting the area setting addresses.

6. A memory controller according to claim 7, wherein the first and second areas are different from each other.

7. A memory controller comprising:

area setting means for setting at least first and second accessible continuous areas of a memory by setting at least a first address and a second address, wherein the first address and second addresses are changeable and wherein the first address represents a start address of the second accessible continuous area and the second address represents an end address of the first accessible continuous area;

address count means for counting an address in the memory in accordance with a clock; and comparing means for comparing the address counted by said address count means with the second address set by said area setting means, wherein said address count means is loaded with the first address representing the start address of the second accessible continuous area of the memory in response to said comparing means showing a coincidence between the counted address and the set second address, wherein said address count means skips any address between the first and second addresses to successively count the addresses in the first and second areas such that the first and second areas can be treated as one continuous accessible area, and wherein said area setting means prepares the first address representing the start address of the second accessible continuous area of the memory before said comparing means shows the coincidence between the counted address and the set second address.

8. A memory controller according to claim 7, wherein said area setting means changes the first address for preparing the next accessible area of the memory before the comparison by said comparing means.

9. A memory controller according to claim 7, wherein the first and second areas are different from each other.

* * * * *

UNITED STATES PATENT AND TRADEMARK OFFICE
CERTIFICATE OF CORRECTION

PATENT NO. : 5,675,770

DATED : October 7, 1997

INVENTOR(S) : YUKIHIKO OGATA

It is certified that error appears in the above-identified patent and that said Letters Patent is hereby corrected as shown below:

<u>IN THE ABSTRACT</u>

Line 8, "become" should read --becomes--.

<u>COLUMN 1</u>

Line 33, "will be" should read --is--;
    Line 34, "a a" should read --a-- and "is" should
        read --will now be--; and
    Line 57, "REQRQ" should read --REFRQ--.

<u>COLUMN 2</u>

Line 12, "RERRQ." should read --REFRQ.--; and
    Line 25, "a power" should read --power--.

<u>COLUMN 3</u>

Line 48, "circuit" should read --circuit of--; and
    Line 55, "circuit" should read --the circuit--.

<u>COLUMN 4</u>

Line 50, "write" should read --writes--.

<u>COLUMN 5</u>

Line 67, "waited." should read --waiting--.

<u>COLUMN 7</u>

Line 51, "operation-and" should read --operation and--.

UNITED STATES PATENT AND TRADEMARK OFFICE
CERTIFICATE OF CORRECTION

PATENT NO. :   5,675,770

DATED      :   October 7, 1997

INVENTOR(S) :  YUKIHIKO OGATA

It is certified that error appears in the above-identified patent and that said Letters Patent is hereby corrected as shown below:

COLUMN 9

Line 22, "other" should read --another--.

COLUMN 10

Line 18, "produces" should read --produce--.

COLUMN 11

Lines 17-18, "is used the" should read --is used in a--.

COLUMN 12

Line 9, "claim 2" should read --claim 2,--; and
    Line 21, "addresses" should read --address--.

Signed and Sealed this

Twenty-third Day of June, 1998

Attest:

BRUCE LEHMAN

*Attesting Officer*     Commissioner of Patents and Trademarks